United States Patent [19]

Murayama et al.

[11] Patent Number: 4,483,751

[45] Date of Patent: Nov. 20, 1984

[54] PROCESS OF TREATING A NODIC OXIDE FILM, PRINTED WIRING BOARD AND PROCESS OF MAKING THE SAME

[75] Inventors: Seizo Murayama; Kazuo Isawa; Masatsugu Maejima; Takayoshi Usuki; Kohichi Saruwatari, all of Tokyo, Japan

[73] Assignee: Fujikura Cable Works, Ltd., Tokyo, Japan

[21] Appl. No.: 344,711

[22] Filed: Feb. 1, 1982

[30] Foreign Application Priority Data

| Feb. 2, 1981 | [JP] | Japan | 56-13946 |
| Feb. 2, 1981 | [JP] | Japan | 56-13943 |
| Feb. 2, 1981 | [JP] | Japan | 56-13942 |
| Mar. 11, 1981 | [JP] | Japan | 56-13945 |
| Mar. 11, 1981 | [JP] | Japan | 56-34974 |

[51] Int. Cl.³ .................. C25D 11/06; C25D 11/18
[52] U.S. Cl. .................. 204/37.1; 174/68.5; 204/37.6; 204/38 A; 204/38 E; 204/58; 204/181 R; 427/96
[58] Field of Search .............. 204/35 N, 37 R, 38 A, 204/38 E, 181 R, 181 N, 14 N, 56 R, 56 M, 58; 427/96, 97; 174/68.5; 29/846, 852; 339/17 A, 17 B, 17 T; 428/901

[56] References Cited

U.S. PATENT DOCUMENTS

| 3,202,591 | 8/1965 | Curran | 204/38 A |
| 3,340,161 | 9/1967 | Zimmerman et al. | 204/15 |
| 3,622,473 | 11/1971 | Ohta et al. | 204/38 A |
| 3,711,313 | 1/1973 | Nagano | 204/38 A |
| 4,130,466 | 12/1978 | Kramer | 204/38 A |
| 4,180,442 | 12/1979 | Byrd | 204/14 N |
| 4,318,939 | 3/1982 | Wong | 427/96 |

OTHER PUBLICATIONS

W. E. Hubner et al., The Practical Anodizing of Aluminum, McDonald and Evans, London, 1960, pp. 44-46.
J. E. Lilienfeld et al., . . . Anodic Layers on Aluminum, The Electrochemical Society, New York, 1935, pp. 67-73.

Primary Examiner—G. L. Kaplan
Assistant Examiner—William T. Leader
Attorney, Agent, or Firm—Cushman, Darby & Cushman

[57] ABSTRACT

A process of treating an anodic oxide film wherein a base material of a valve metal is anodized to form the anodic oxide film thereon, which is then impregnated with a polymerizable organic metal compound and thereafter subjected to polymerization of the compound, whereby the micropores of the anodic oxide film are filled and sealed with the polymerized organometallic compound. According to this process, there is provided a base material having an anodic oxide film impregnated with polymerized organometallic compound which is excellent in heat resistance, heat radiance, and electrical insulation, and hence the base material is useful for the printed wiring board, electrically-insulative heat sink, heat-resistant insulated wire and the like.

9 Claims, 5 Drawing Figures

PROCESS OF TREATING A NODIC OXIDE FILM, PRINTED WIRING BOARD AND PROCESS OF MAKING THE SAME

BACKGROUND OF THE INVENTION

This invention relates to a method of treating anodic oxide films or coatings to provide thereto high heat radiance, heat resistance and electrical insulation, a printed wiring board using such anodic oxide film and a method of making the same.

Anodic oxide films formed on valve metals such as aluminum, titanium, magnesium, tantalum, and their alloys are electrically insulating metallic oxide films which are conversion-coated on their surfaces. The anodic oxide films have homogeneous composition and are excellent in adhesion to their base metal, corrosion resistance and thermal conductivity. By the use of these properties metals having anodic oxide films formed thereon are widely used for printed wiring boards of electronic instruments, radiator plates of electronic parts, electrically insulative heat sinks, insulated wires, building materials and the like. In order to enhance insulation and corrosion properties thick anodic oxide films are used for such use, but for the oxide films having a thickness of not less than several microns a great number of micropores are necessarily formed therein. The micropores are very small holes having a diameter of several hundred angstroms which reach the barrier layer of the anodic oxide film. Entrance of moisture in the air into and residue of anodizing electrolytic solution in the micropores make it impossible to obtain a thick anodic oxide film having sufficiently high electrical insulation and corrosion resistance. To avoid these drawbacks sealing treatment can be rendered on the micropores for sealing thereof by the use of steam or boiling water. However by such treatment the anodic oxide film is subjected to hydration and cracks are produced in thus hydrated film merely by heating it up to around 150° C.

With respect to anodic oxide films subjected to no sealing treatment cracks occur therein by heating up to about 200° C. The cracking is caused by thermal stresses in the anodic oxide film due to the difference in coefficient of thermal expansion between the film and its base metal. Cracked anodic oxide films are inferior in electrical insulation and corrosion resistance.

For the sealing of the micropores there has been proposed another treatment that the micropores are impregnated with resins and the like. However micropores of almite films, for instance, have a very small diameter of several hundred angstroms and a depth of several ten micrometers and hence it in practice impossible to impregnate the micropores with resins to their innermost portions because of viscosity thereof.

To solve this problem it has been proposed that electrodischarge is effected in an atmosphere of a gas of an organometallic compound such as organic silicon compound with an anodic oxide film made as one electrode, thereby depositing the organometallic compound in the micropores and on the surface of the oxide film. (Japanese Patent Publication (examined) or Koukoku Kouhou No. 49-4719). Since this treatment employs the electric discharge phenomenon, it is impossible to control the deposition position of the organometallic compound, so that it is difficult to sufficiently fill the micropores with the compound. Further the treatment has disadvantages that electric insulation property of the anodic oxide film is liable to be deteriorated due to moisture in the air since according to this treatment the organic metal compound cannot be compactly deposited and discharge current paths remain in the deposited compound.

SUMMARY OF THE INVENTION

Accordingly, the object of the present invention is to avoid the above-mentioned drawbacks. One aspect of the present invention is directed to a process of treating an anodic oxide film, comprising the steps of: anodizing a base material of a valve metal to form the anodic oxide film thereon; impregnating the anodic oxide film with a polymerizable organometallic compound; and thereafter polymerizing the polymerizable organic metal compound for hardening thereof, whereby the micropores of the anodic oxide film are filled and sealed with the polymerized organic metal compound. According to this process, there is provided a base material having an anodic oxide film impregnated with polymerized organometallic compound which is excellent in heat radiance, heat resistance and electric insulation, and is hence useful for the printed wiring board, electrically insulative heat sink, heat-resistant insulated wire and the like.

According to another aspect of the present invention, there is provided a printed wiring board having excellent heat radiance, heat resistance, and electric insulation. The printed wiring board comprises a base metal plate having an anodic oxide film formed thereon with micropores filled and sealed with an organometallic compound polymer material produced according to the process of the present invention, and a conductor circuit disposed on the organic metal compound polymer material. The above printed wiring board is produced according to a process which comprises the steps of: anodizing a base metal plate of a valve metal to form an anodic oxide film thereon; impregnating the anodic oxide film with a polymerizable organometallic compound, and polymerizing and hardening the polymerizable organic metal compound to form an organic metal compound polymer material thereby filling and sealing the micropores of the anodic oxide film, and thereafter disposing a conductor circuit on the polymer material.

DETAILED DESCRIPTION OF THE INVENTION

The metals and their alloys employed as base metal in the present invention are anodizable valve metals such as aluminum, magnesium, titanium, tantalum, and their alloys.

Aluminum or aluminum alloy base materials employed in the present invention include, for example, JIS-1 (A-1100) aluminum, high tensile aluminum alloy plate, corrosion-resistant aluminum alloy, and the like. Use may be made of aluminum-silicon alloy which contains not more than about 20% by weight, preferably about 5 to 15% by weight of silicon and if necessary a small amount of additives. The aluminum-silicon alloy has a property that its thermal expansion coefficient is in inverse proportion to silicon content in the alloy. For example, aluminum-silicon alloy containing 11% by weight of silicon has a thermal expansion coefficient of $1.97 \times 10^{-6}$, while aluminum and aluminum oxide have those of about $25 \times 10^{-6}$ and about $6 \times 10^{-6}$, respectively. This property provides a smaller difference in thermal expansion between aluminum-silicon alloy plate as base metal and an anodic oxide film formed thereon, so that the anodic oxide film formed on aluminum-silicon alloy plate has a less possibility of cracking and crazing than that of aluminum plate. The aluminum-silicon alloy contains silicon particles dispersed in an aluminum continuous phase and when anodized, the silicon particles remain in an anodic oxide film. The silicon particles serve to prevent or at least minimize the cracking of the anodic oxide film. Beyond about 20% by weight of silicon the insulating property of the anodic oxide film is largely degraded and is not acceptable for practical use.

The magnesium material employed in the present invention may be any of those capable of forming an anodic oxide film including magnesium alloy such as the conventional ASTM AZ31C and AZ61A.

In the case of producing a printed wiring board, a through hole, opening for attaching an electrical or electronical parts and the like may be previously formed in the base plate of valve metal.

The base materials of the previously-mentioned metals or their alloys are anodized in an electrolytic bath such as sulfuric acid, oxalic acid and the like to form an anodic oxide film thereon. With base materials for the printed wiring board, an anodic oxide film having a thickness of about 5 to about 200 μm is formed.

Anodizing treatment of base materials of aluminum or aluminum alloy is carried out in an electrolytic bath containing, for example, an ammonium salt such as ammonium tartrate, ammonium hydroxide, ammonium carbonate, and ammonium fluoride, or a sodium salt such as sodium hydroxide, and sodium pyrophosphate. The ammonium ion concentration in the electrolytic bath may be within a range of about 5 to about 80 g/l, and preferably about 5 to 40 g/l. The sodium ion concentration in the electrolytic bath may be within a range of about 1 to 30 g/l, and preferably about 1 to about 20 g/l. The bath temperature may be within a range of about 5° to 40° C., and current density may be of about 0.5 to 10 A/dm². In anodic oxide films obtained on the basis of the above-mentioned electrolytic bath and electrolysis conditions, temperatures above which cracking of the films occurs are raised, and heat resistance of the films is enhanced.

Alternatively, the anodizing treatment may be carried out by the use of about 4 to about 25% by weight, preferably about 7 to about 20% by weight, of aqueous oxalic acid solution as an electrolytic bath under the conditions of a bath temperature of about 20° to 50° C. and a current density of about 0.5 to 10 A/dm², preferably 1.5 to 5 A/dm² with an aluminum plate or aluminum alloy plate being made the anode and a suitable inert conductor such as stainless steel piece the cathode. By restricting anodizing conditions to within the above outer limitations cracking temperature of the alumite film thus formed can be raised, and hence heat resistance of the film is improved. The results of comparative tests showing this fact are given in TABLES 1 and 2.

The process of forming an anodic oxide film on the magnesium base material used in the present invention may be any one of the conventional treatments such as HAE (U.S. Pat. No. 2,880,148, ASTM Class II Type III), Dow Anodizing (ASTM Class II type II) and the like. (See for example "KINZOKU HYOMEN GIJUTSU BINRAN" published by NIKKAN KOGYO SHINBUNSHA, Japan, 1976, pp. 710–711).

Thus-formed anodic oxide film is impregnated with a polymerizable organometallic compound. Before this impregnation, if needed, the anodic oxide film may be subjected to the well-known sealing treatment by the use of steam, boiling water, and the like.

The polymerizable organic metal compounds employed in the present invention have a metallic atom combined with hydrolyzable organic group, halogen group and functional group, and are represented by the general formula $$X_n MR_m$$

wherein M is a metallic atom such as Si, Ti, Zr, Al, B, P, Ge, and Sn; X is an organic functional group such as vinyl, amino, mercapto, epoxy, methyl, and phenyl groups; R is a hydrolyzable organic group such as alkoxy and acetoxy groups; and n+m=3, 4, 5, or 6. Such organometallic compounds include, for example, organosilicon compound such as phenyltriethoxysilane, methyltriethoxysilane, vinyltris(β-methoxyethoxy)silane, β-(3,4-epoxy-cyclohexyl)ethyltrimethoxysilane, and γ-glycideoxypropyltrimethoxysilane; organotitanium compound such as tetraisopropylbis(dioctylphosphite)titanate, tetraoctylbis(ditridecylphosphite)titanate, titanacetylacetonate, titanoctyleneglycolate, dihydroxybis(lactato)titan, and tetrastearoxytitan; organoaluminum compound such as aluminumtri.n.butoxide, methylaluminumseskichroride, and aluminumtriisopropoxide; organozirconium such as zirconiumtetraisopropoxide, and tetra(n-butoxy)zirconium; organic phosphate compound such as tri(n-butyl ester)phosphate and diethyl ester phosphite; organoboron compound such as tri.n-butyl ester borate and triisopropyl ester borate; organogermanium compound such as dimethyloxydimethyl germanium, and methylgermanium trimethoxide; dimethyloxyethyl tin; and their derivatives and oligomers. The organic metal compounds employed in the present invention preferably contain Si, Al, Zr or Ti as a metallic aton. Further the organic metal compound contains preferably methyl and/or phenyl group as an organic functional group for improving heat resistance of the anodic oxide film. The organic metal compound of which hydrolysis takes place gradually is preferred in the present invention. The above-mentioned polymerizable organic metal compounds are used in the form of a solution in organic solvent such as methanol, ethanol, acetone, ethyl acetate, and methyl ethyl ketone; water; or mixture of water and a water soluble organic solvent. Such soluble organic solvent may include methanol, ethanol, isopropanol, acetone, dioxane, ethylene glycol, methyl acetate, methyl ethyl ketone, diacetone alcohol, ethyl formate, dimethylformamide, and the like. An additive such as surfactant may be added to the soluble organic solvent, if needed.

The anodic oxide film formed on a base material may be immersed in a solution of the above-listed organic metal compound where the organic metal compound is diffused or permeates into the micropores of the film, or in another embodiment of the invention the solution is applied onto the surface of the anodic oxide film to form a layer of a polymerizable organic metal compound. In a further embodiment of the invention the impregnation of the organic metal compound is carried out by vacuum impregnation treatment. Furthermore, the impregnation is achieved by electrophoresis or electropermeation in which an anodic oxide film is immersed in a solution of a polymerizable organic metal compound in water or a mixture of water and a water soluble organic solvent, and then direct current is applied between the anodic oxide film as the anode and a suitable inert conductor such as stainless steel piece as the cathode so that the micropores of the film are fully impregnated with the organic metal compound from their bottom to open end. After impregnation of the anodic oxide film with the polymerizable organic metal compound, the solution of the organic metal compound adhered to the surface of the film is sufficiently wiped off to provide a high thermal conductivity or is remained without wiping to provide a high electrical insulation. The anodic oxide film is dried to remove the water and the organic solvent in the solution after the polymerizable organic metal compound is fully adhered to and deposited in the micropores or on the surface of the film.

Finally, the organic metal compound thus deposited is polymerized by conventional treatment such as heating, so that a compact organic metal compound polymer material is obtained. The organic metal compound polymer has high affinity to the anodic oxide film, and hence it strongly adhered to the walls of the micropores or the surface of the film, and fills compactly the micropores or positively cover the surface.

The anodic oxide film subjected to the sealing treatment with an organic metal compound according to the present invention has micropores compactly filled with the organic metal compound polymer and may have a surface covered with the polymer, and thus very high electric insulation is given to the anodic oxide film. The organic metal compound polymer material can be deposited only in the micropores of the anodic oxide film by previously wiping off the solution of the organic metal compound adhered to the surface of the film. Also in this case the film has sufficient electrical insulation of the film even up to about 150° C. as well as excellent thermal conductivity. The anodic oxide film covered with the organic metal compound polymer which is metallic and hence excellent in thermal conductivity has much higher thermal conductivity than those covered with any other conventional resins.

The thus prepared base plate on which a wiring conductor can be mounted may be used as a printed wiring board having excellent heat resistance, electrical insulation and heat radiance.

In order to manufacture such a printed wiring board, an anodic oxide film is formed on a base plate of a valve metal having a recess for attaching a part, through holes, etc. previously formed therein, and then the film is impregnated with a polymerizable organic metal compound by diffusion, vacuum impregnate, electrophoresis and the like as previously described.

By such treatment the through holes and part-attaching recess of the printed wiring board are insulated without any difficulty. Anodizing treatment which has a good throwing power can form an anodic oxide film of a uniform thickness on the wall surfaces of the recess. This is because thick grown portion of the anodic oxide film has a larger resistance which causes the current to flow through a thin portion of the film which has a lower resistance with a tendency to make the thickness of the film uniform. Also in the impregnation with an organic metal compound by electrophoresis resistance gradually increases and current becomes less easy to flow with the progress of the impregnation and thus current flows sufficiently through a portion relatively difficult to be impregnated, so that the impregnation is carried out uniformly and even the wall of the part-attaching recess and the like can be sufficiently impregnated with the organic metal compound.

Then, the anodic oxide film impregnated with the polymerizable organic metal compound is subjected to heating or photopolymerization treatment to polymerize the compound. A circuit conductor is formed on or in the anodic oxide film thus impregnated with an organic metal compound polymer. This formation of the circuit conductor is carried out by either directly forming a circuit in the film by means of a well-known method such as electroless plating, vacuum evaporation, ion sputtering, and ion plating or adhering to the film a film of copper, nickel or the like which is then subjected to etching to form a desired wiring circuit of a thickness about several ten microns. The copper or nickel film as a conductor may be attached to the anodic oxide film through the polymerizable organic metal compound applied on the film in place of adhesive and thereafter the organic metal compound is polymerized to form a printed wiring board with the conductor fixedly attached to the film.

Figure 1:
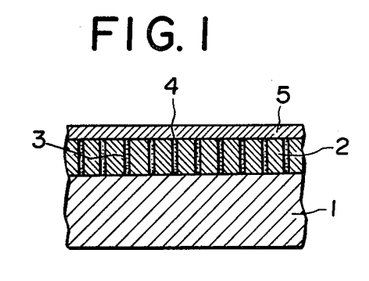
FIG. 1 is a diagrammatic cross section of a printed wiring board, according to the present invention, having an alumite film formed thereon with micropores filled with an organometallic compound polymer.
Figure 2:
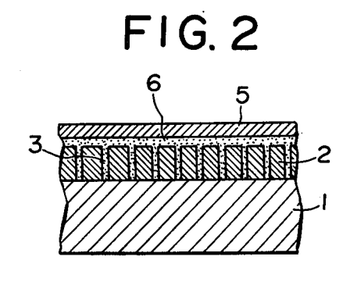
FIG. 2 is a diagrammatic cross section of a printed wiring board, according to the present invention, having an organometallic compound polymer layer formed on an alumite surface thereof as well as the polymer deposit in its micropores.

Two embodiments of the printed wiring board thus obtained according to the present invention are illustrated in FIGS. 1 and 2, in which an aluminum plate 1 is used as an anodizable metal plate. In FIG. 1, the micropores 3 of an alumite film 2 formed on the aluminum plate are filled with an organic metal compound polymer 4 and a wiring conductor 5 is formed directly on the outer surface of the alumite film 2. In FIG. 2, an organometallic compound polymer layer 6 is further formed between the alumite film 2 and the wiring conductor 5.

The anodic oxide film of a printed wiring board treated with a polymerizable organic metal compound according to the present invention has micropores compactly filled with an organic metal compound polymer or a surface covered with the latter as well as its through hole and hence has very high electrical insulation. The organic metal compound polymer can be deposited only in the micropores, which results in improvement of electrical insulation as well as high thermal conductivity. Furthermore, its electrical insulation at high temperatures (about 150° C.) is enhanced. In addition the anodic oxide film filled and covered with the polymer which is metallic and hence excellent in thermal conductivity has much higher thermal conductivity and heat radiance than that covered with any other conventional resins.

When an aluminum-silicon alloy is used as a base metal, the difference in thermal expansion coefficient between the base metal and an anodic film formed thereon becomes smaller, so that cracking of the film is prevented or at least minimized when heated and electrical insulation thereof at high temperatures is improved.

In order to prevent more positively heat cracking of an anodic oxide film impregnated with a polymerized organic metal compound, it is recommended that cracks are previously generated in the anodic oxide film by heating, and then the micropores and cracks of the oxide film are impregnated with the polymerizable organic metal compound, which is thereafter polymerized. In the anodic oxide film thus formed there will be no cracking by heating up to the temperature of the heat treatment.

To improve further heat radiance, corrosion resistance and electrical insulation of the printed wiring board, it is preferred to use an aluminum plate cladded with the other metal plate as a base plate.

COMPARATIVE TEST 1

Six sample plates of AA1100 aluminum (hereinafter referred to as 2S aluminum) and 50 mm × 100 mm × 1 mm in dimensions were prepared and anodized in 10% by weight of aqueous oxalic acid solution under the temperature and current density conditions described in TABLE 1 to a film thickness of 30μ. The sample plates having anodic oxide films thus formed were each heated up to a temperature at which cracking of the film was noted. The cracking temperatures are shown in the following table.

TABLE 1

| D.C. Current Density (A/dm$^2$) | 1 | | | 2 | | |
|---|---|---|---|---|---|---|
| Bath Temperature (°C.) | 10 | 20 | 30 | 10 | 20 | 30 |
| Cracking Temperature (°C.) | 300 | 300 | 400 | 300 | 500 | 500 |

The results show that an anodic oxide film formed by anodizing at 20° C. or more using a current density of 1.5 A/dm$^2$ or more will crack at not less than 400° C., and is excellent in heat resistance.

COMPARATIVE TEST 2

Twenty one sample plates of 2S aluminum having dimensions of 50 mm × 100 mm × 1 mm were prepared and anodized in specific concentrations of aqueous oxalic acid solution using a current density of 2 A/dm$^2$ to a film thickness of 30μ. The anodization was carried out at 30° C., 42° C., and 50° C. for 3 to 15, 20, and 25% by weight of oxalic acid solution, respectively. The sample plates were then heated and judgement as to whether or not cracking of the anodic oxide film occurs were made on each sample plate. The results are shown in TABLE 2.

TABLE 2

| Concentration of Aqueous Oxalic Acid Solution (wt %) | Heating Temperature (°C.) | | |
|---|---|---|---|
| | 200 | 300 | 400 |
| 3 | None | Present | Present |
| 4 | None | None | Present |
| 5 | None | None | None |
| 10 | None | None | None |
| 15 | None | None | None |
| 20 | None | None | None |
| 25 | None | None | None |

EXAMPLE 1-6

Figure 3:
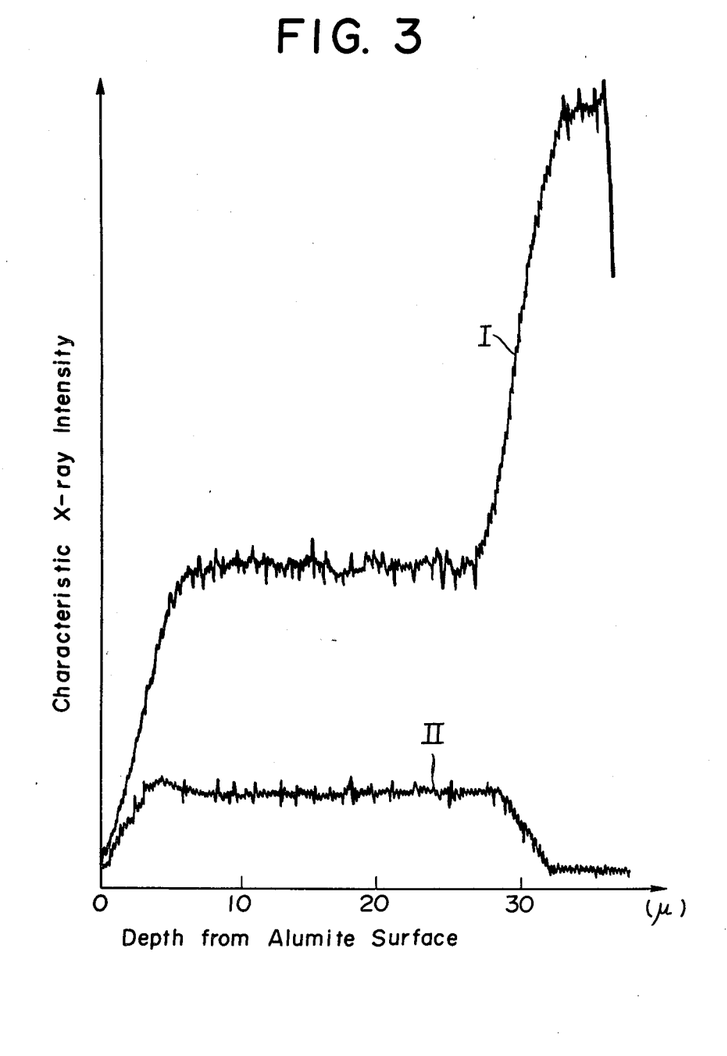
FIG. 3 is an experimental graph obtained by means of an X-ray microanalyzer and showing an organic metal compound polymer filled according to the present invention in micropores of an alumite film formed on an aluminum plate, in which graph I and II show distributions of Al and Si, respectively.

For each example a test piece of aluminum or aluminum alloy was introduced into an acid bath or ammonium bath of which composition is given in TABLE 3A and anodization was carried out under the specific conditions to form an anodic oxide film on the test piece. Then, the test piece was immersed in an impregnating solution containing a polymerizable organic metal compound as shown in the table, where electrophoresis or electropermeation of the organic metal compound was carried out by making the anodic oxide film thus formed the anode with application of a predetermined direct current voltage for a predetermined period of time. After the test piece was taken up from the impregnating solution, the solution adhered to the surfaces thereof was either removed sufficiently by wiping off or remained, and then the test piece was dried up by exposing it to warm air. Thereafter the organometallic compound in the pores of the anodic oxide film was polymerized by heating. After the polymerization the A.C. dielectric strength between the anodic oxide film and the underlying base metal was determined, after which the sample in Example 2 was analyzed by means of an X-ray microanalyzer and it was noted that the micropores of the anodic oxide film was as shown in FIG. 3 impregnated with the organic metal compound to the innermost portion. Then the samples were subjected to heating at 300° C. for 30 minutes except in Example 2, but neither cracking of the anodic oxide film nor degradation of electrical insulation thereof were noted. Further all the samples were allowed to stand in a room for a week, but no degradation of electrical insulation due to moisture in the air was noted.

EXAMPLE 7-13

For each example an anodic oxide film was formed on an aluminum or aluminum alloy plate and impregnated with polymerized organic metal compound as in Examples 1 to 4 under the conditions given in TABLES 3A. After the film thus formed was subjected to activation in an aqueous palladium chloride solution (0.5 g/l) at room temperature for 10 minutes, chemical nickel plating was carried out on the film to form a wiring conductor with a mask. The A.C. electric strength between the wiring conductor and the base metal was determined. With Examples 10 and 11 the printed wiring boards thus obtained were heated up to 350° C. for 20 minutes and with Example 7 up to 300° C. for 30 minutes, but no cracking of the anodic oxide films was noted. In addition every sample was allowed to stand in a room for one week, but no degradation of electric insulation was noted.

TABLE 3A

| Example | 1 | 2 | 3 | 4 | 5 |
|---|---|---|---|---|---|

TABLE 3A-continued

| Base Material | 2S aluminum plate | 2S aluminum plate | 2S aluminum plate | 2S aluminum plate | 2S aluminum plate |
|---|---|---|---|---|---|
| Dimensions (mm) | 100 × 50 × 1 | 100 × 50 × 1 | 100 × 50 × 1 | 100 × 50 × 1 | 100 × 50 × 1 |
| Anodizing Treatment | | | | | |
| Electrolytic solution | | | | | |
| $(NH_4)_2C_4H_4O_6$ (M/l) | 0.1 | — | — | — | — |
| $NH_4OH$ (M/l) | 2.3 | — | — | — | — |
| $(NH_4)_2CO_3$ (M/l) | 0.1 | — | — | — | — |
| $NH_4F$ (M/l) | 0.3 | — | — | — | — |
| Aqueous oxalic acid solution (wt %) | — | — | 4 | 4 | 25 |
| Aqueous sulfuric acid solution (wt %) | — | 15 | — | — | — |
| Bath temperature (°C.) | 15 | | 20 | 20 | 50 |
| Current density (A/dm$^2$) | 2 | | 0.5 | 5 | 0.5 |
| Anodic oxide film thickness (μm) | 12 | 30 | 30 | 30 | 30 |
| Impregnating Treatment | | | | | |
| Impregnating solution (vol %) | | | | | |
| $HSC_2H_4Si(OC_2H_5)_3$ | 50 | — | — | — | — |
| $C_2H_5OH$ | 49 | — | 5 | 5 | 5 |
| Water | 1 | — | 10 | 10 | 10 |
| Phenyltriethoxysilane | — | — | — | — | — |
| Isopropanol | — | — | — | — | — |
| Vinyl triethoxysilane | — | — | — | — | — |
| Aqueous solution of $CH_2=CHSi(OC_2H_4OCH_3)_3$ | — | 4 | — | — | — |
| $CH_3Si(OC_2H_5)_3$ | — | — | 85 | 85 | 85 |
| Ethanol solution of $CH_2=CHSi(OC_2H_4OCH_3)_3$ | — | — | — | — | — |
| Direct current voltage (volt) | 500 | 250 (initial)*1,2 400 (final) | 1000 | 1000 | 1000 |
| Current density (mA/dm$^2$) | | | | | |
| Treatment time (min.) | 30 | 120 | 30 | 30 | 30 |
| Organic metal compound on outer surface of anodic oxide film | Removed by wiping | Removed by wiping | Remained | Remained | Remained |
| Polymerizing Treatment | | | | | |
| Temperature (°C.) | 130 | 130 | 130 | 130 | 130 |
| Treatment time (hour) | 2 | 2 | 2 | 2 | 2 |
| Dielectric Strength (V) | 200 or more | 800 or more | 800 or more | 800 or more | 800 or more |

| EXAMPLE | 6 | 7 | 8 | 9 | 10 |
|---|---|---|---|---|---|
| Base Material | 2S aluminum plate | 2S aluminum plate | 2S aluminum plate | 2S aluminum plate | Al—Si alloy plate*3 |
| Dimensions | 100 × 50 × 1 | 100 × 50 × 1 | 100 × 50 × 1 | 100 × 50 × 1 | 100 × 50 × 2 |
| Anodizing Treatment | | | | | |
| Electrolytic solution | | | | | |
| $(NH_4)_2C_4H_4O_6$ (M/l) | — | — | — | — | — |
| $NH_4OH$ (M/l) | — | — | — | — | — |
| $(NH_4)_2CO_3$ (M/l) | — | — | — | — | — |
| $NH_4F$ (M/l) | — | — | — | — | — |
| Aqueous oxalic acid solution (wt %) | 25 | 10 | — | — | 5 |
| Aqueous sulfuric acid solution (wt %) | — | — | 15 | 15 | — |
| Bath temperature (°C.) | 50 | 30 | | | |
| Current density (A/dm$^2$) | 5 | 2 | | | |
| Anodic oxide film thickness (μm) | 30 | 20 | 30 | 30 | 30 |
| Impregnating Treatment | | | | | |
| Impregnating solution (vol %) | | | | | |
| $HSC_2H_4Si(OC_2H_5)_3$ | — | — | — | — | — |
| $C_2H_5OH$ | 5 | — | 60 | — | — |
| Water | 10 | 1 | 10 | — | 0.4 |
| Phenyltriethoxysilane | — | 50 | — | — | 50 |
| Isopropanol | — | 49 | — | — | 49.6 |
| Vinyl triethoxysilane | — | — | — | — | — |
| Aqueous solution of $CH_2=CHSi(OC_2H_4OCH_3)_3$ | — | — | — | 4 | — |
| $CH_3Si(OC_2H_5)_3$ | 85 | — | 30 | — | — |
| Ethanol solution of $CH_2=CHSi(OC_2H_4OCH_3)_3$ | — | — | — | — | — |
| Direct current voltage (volt) | 1000 | 500 | 400 (initial)*2 500 (final) | 250 (initial)*2 400 (final) | 500 |
| Current density (mA/dm$^2$) | | | | | 11 (initial) 6 (final) |
| Treatment time (min.) | 30 | 30 | 60 | 120 | 60 |
| Organic metal compound on outer surface of | Remained | Remained | Remained | Removed by wiping | Removed by wiping |

TABLE 3A-continued

| | | | | | |
|---|---|---|---|---|---|
| anodic oxide film | | | | | |
| Polymerizing Treatment | | | | | |
| Temperature (°C.) | 130 | 130 | 130 | 130 | 130 |
| Treatment time (hour) | 2 | 2 | 2 | 2 | 2 |
| Dielectric Strength (V) | 800 or more | 500 | 1000 or more | 800 or more | 400 or more |

| | EXAMPLE | 11 | 12 | 13 |
|---|---|---|---|---|
| | Base Material | Al—Si alloy plate[*4] | 2S aluminum plate[*5] | 2S aluminum plate[*5] |
| | Dimensions (mm) | 100 × 50 × 2 | 100 × 50 × 2 | 100 × 50 × 2 |
| | Anodizing Treatment | | | |
| | Electrolytic solution | | | |
| | $(NH_4)_2C_4H_4O_6$ (M/l) | — | — | — |
| | $NH_4OH$ (M/l) | — | — | — |
| | $(NH_4)_2CO_3$ (M/l) | — | — | — |
| | $NH_4F$ (M/l) | — | — | — |
| | Aqueous oxalic acid solution (wt %) | 5 | — | — |
| | Aqueous sulfuric acid solution (wt %) | — | 15 | 15 |
| | Bath temperature (°C.) | | | |
| | Current density (A/dm$^2$) | | | |
| | Anodic oxide film thickness (μm) | 30 | 30 | 30 |
| | Impregnating Treatment | | | |
| | Impregnating solution (vol %) | | | |
| | $HSC_2H_4Si(OC_2H_5)_3$ | — | — | — |
| | $C_2H_5OH$ | — | — | — |
| | Water | 0.4 | — | 0.4 |
| | Phenyltriethoxysilane | 50 | — | 50 |
| | Isopropanol | 49.6 | — | 49.6 |
| | Vinyl triethoxysilane | — | — | — |
| | Aqueous solution of $CH_2=CHSi(OC_2H_4OCH_3)_3$ | — | — | — |
| | $CH_3Si(OC_2H_5)_3$ | — | — | — |
| | Ethanol solution of $CH_2=CHSi(OC_2H_4OCH_3)_3$ | — | 4 | — |
| | Direct current voltage (volt) | 500 | 250 (initial) | 500 |
| | Current density (mA/dm$^2$) | 11 (initial) 6 (final) | 25 | 10 (initial) 6 (final) |
| | Treatment time (min.) | 60 | 120 | 60 |
| | Organic metal compound on outer surface of anodic oxide film | Removed by wiping | Removed by wiping | Removed by wiping |
| | Polymerizing Treatment | | | |
| | Temperature (°C.) | 130 | 130 | 130 |
| | Treatment time (hour) | 2 | 2 | 2 |
| | Dielectric Strength (V) | 700 | 800 | 1100 or more |

[*1]In the Table "initial" and "final" means initial voltage or current density and final voltage or current density, respectively.
[*2]Using constant current of 25 mA.
[*3]Plate made of aluminum-silicon alloy containing 11% by weight of silicon and having through holes which have each a spherical portion and a minimum diameter of 1 mm.
[*4]Plate made of aluminum silicon alloy containing 5% by weight of silicon.
[*5]Plate having through holes which have each spherical portion and a minimum diameter of 1 mm.

EXAMPLE 14

An aluminum-silicon alloy plate containing 11% by weight of silicon and having through holes of minimum diameter 1 mm was prepared, the through holes each having a spherical portion. An anodic oxide film was formed on the aluminum-silicon alloy plate and impregnated with a polymerized organic metal compound as in Examples 1 to 4 under the conditions given in TABLE 3B. After the film was subjected to masking, it was immersed in an aqueous stannous chloride solution (10 g/l) for 30 seconds and then subjected to activation treatment in an aqueous palladium chloride solution (0.5 g/l) after washing with water. Thereafter the film was subjected to chemical nickel plating to form a wiring conductor thereon. A.C. dielectric strength between the circuit conductor and the underlying aluminum alloy plate was 400 V. Then the sample was subjected to heating at 300° C. for 30 minutes but no cracking of the film was noted. Such were the case with the through holes. After the plate was allowed to stand in a room for a week, no degradation of electrical insulation was noted.

EXAMPLE 15

An anodic oxide film was formed on the magnesium alloy plate (JIS-1) and impregnated with a polymerized organic metal compound as in Examples 1 to 4 under the conditions described in TABLE 3B. After the film thus formed was subjected to masking, it was immersed in an aqueous stannous chloride solution (5 g/l) for 30 seconds and then in an aqueous palladium chloride solution (0.5 g/l) for 30 seconds after washing. Thereafter the film was immersed in a shumer electroless nickel plating solution at 80° C. for one minute to form a circuit thereon. A.C. dielectric strength between the circuit conductor and the base metal was 700 V or more.

EXAMPLE 16

Figure 4:
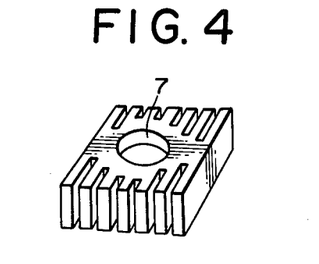
FIG. 4 illustrates a perspective view of a heat sink material having fins which is processed according to the present invention.

A heat radiant fin material made of extrudate of 6063 aluminum alloy having a cylindrical hole 7 of 25 mm diameter and 8 mm depth was prepared as shown in FIG. 4. The bottom of the hole was needed to be subjected to insulation treatment since this portion was to be in contact with an electric circuit. The material was subjected to anodization and then electrophoresis treatment after washing and drying under the conditions as given in TABLE 3B. After the fin material thus treated was wiped off and dried up at room temperature, it was heated up to 170° C. for 2 hours for polymerization of the organometallic compound.

EXAMPLE 17

Figure 5:
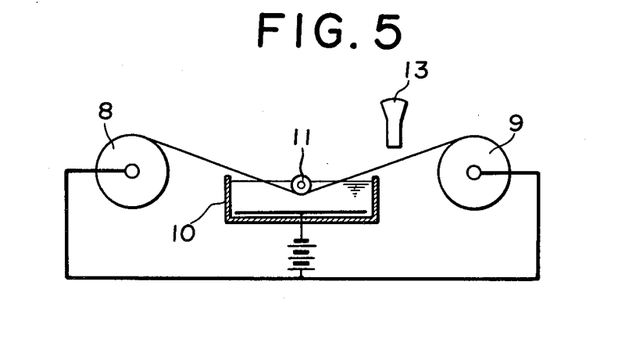
FIG. 5 illustrates a diagrammatic view of an apparatus used in the present invention for treating electrophoretically an aluminum wire with an organic metal compound solution.

An EC aluminum wire of 2 mm diameter was anodized by the well-known continuous line process including degreasing, first washing with water, anodization, second washing with water, and drying, the anodization being carried out under the conditions given in TABLE 3B. To obtain about 10 kg of the aluminum wire having an anodic oxide film of 10μ thickness. Subsequently, the aluminum wire was subjected to impregnation by electrophoresis with an apparatus as shown in FIG. 5, in which a wire feeding drum 8 around which the aluminum wire was wound and a winding drum 9 were disposed on the opposite sides of a tank 10 containing a solution of 85 vol % of methyltriethoxysilane, 10 vol % of water and 5 vol % of ethanol. The both ends of the aluminum wire were electrically connected to the metal bearings of the drums so that current flowed between the bearings. Then the wire was tightened and the center portion thereof was kept in the organic metal compound solution in the tank 10 by means of a pulley 11 for 5 minutes while the wire was being wound by the drum 9 with application of a D.C. voltage of 1000 V between a stainless electrode 12 disposed in the tank 10 and the aluminum wire. Before being wound around the drum 9, the wire was dried up by a blower 13. The drum 9 was introduced into a thermoregulator (not shown) at 150° C. for 2 hours for polymerization of the organic metal compound electrophoretically deposited on the anodic oxide film of the wire.

TABLE 3B

| EXAMPLE | 14 | 15 | 16 | 17 |
| --- | --- | --- | --- | --- |
| Base Material | Al—Si alloy plate | Magnesium alloy plate | Extrudate of 6063 aluminum alloy | EC aluminum wire of diameter |
| Dimensions (mm) | 100 × 50 × 2 | 100 × 50 × 1 | 50 × 50 × 10 | 2 mm |
| Anodizing Treatment | | | | |
| Electrolytic solution | | | | |
| Aqueous oxalic acid solution (wt %) | 10 | — | 15 | 17 |
| Aqueous solution including | | | | |
| $NH_4F \cdot HF$ (g/l) | — | 300 | — | — |
| $Na_2Cr_2O_7 \cdot 2H_2O$ (g/l) | — | 100 | — | — |
| $H_3PO_4$ (85 wt %) (ml/l) | — | 90 | — | — |
| Bath temperature (°C.) | 30 | 75 | 35 | 40 |
| Current density (A/dm$^2$) | 4 | 5 | 2 | 2 |
| Anodic oxide film thickness (μm) | 30 | 30 | 30 | 10 |
| Impregnating Treatment | | | | |
| Impregnating solution (vol. %) | | | | |
| $CH_3Si(OC_2H_5)_3$ | — | 85 | 85 | 85 |
| $C_2H_5OH$ | 48 | 5 | 5 | 5 |
| Water | 2 | 10 | 10 | 10 |
| Vinyl triethoxysilane | 50 | — | — | — |
| Direct current voltage (volt) | 500 | 1000*[6] | 1500 | 1000 |
| Treatment time (min.) | 60 | 60 | 30 | 5 |
| Organic metal compound on outer surface of anodic oxide film | Removed | Remained | Remained | Remained |
| Polymerizing Treatment | | | | |
| Temperature (°C.) | 120 | 150 | 170 | 150 |
| Treatment time (hour) | 2 | 2 | 2 | 2 |
| Dielectric Strength (V) | 400 | 700 or more | 800 | 400 |

*[6]Using a current of 15 mA.

EXAMPLES 18-25

Anodization was carried out on a test piece for each example in an electrolytic solution of which composition is given in TABLE 4. The test piece having an anodic oxide film thus formed thereon was immersed in an impregnating solution of which composition is described in the table and impregnated with a polymerizable organic metal compound contained in the solution by vacuum impregnate. After the test piece was taken up from the impregnating solution, the solution adhered to the surfaces thereof was removed by wiping off and then the test piece was dried up by exposing it to warm air except that in Examples 22 and 23 the test pieces were dried at room temperature. Thereafter the organic metal compound impregnated into the anodic oxide film was polymerized by heating. Dielectric strength between the film thus obtained and the underlying base metal was determined. With respect to Examples 18, 19, and 20 the test pieces were then heated up to 300° C. for 30 minutes, but no cracking of the films was noted. Although the test pieces thus treated in Examples 20 and 23 were allowed to stand in a room for one week, no degradation of electric strength due to moisture was noted.

EXAMPLE 26

A plate made of aluminum-silicon alloy containing 9% by weight of silicon was prepared. The plate had through holes each having a spherical portion and minimum diameter 1 mm. An anodic oxide film was under the conditions given in TABLE 4 formed on the plate and impregnated with an organic metal compound, which was then polymerized, as in Examples 18-25. The film thus formed was subjected to electroless nickel plating as in Example 14 to form a circuit conductor thereon. The A.C. electric strength between the circuit conductor and the underlying aluminum alloy plate was not less than 800 V. No cracking of the film was noted at a heating test at 300° C. for 30 minutes. Such were the case with the films of the through holes. No degradation of electric strength due to moisture was noted after it was allowed to stand in a room for one week.

EXAMPLE 27

A sample plate was prepared as indicated under Example 26 using an aluminum-silicon alloy containing 11% by weight of silicon. An anodic oxide film impregnated with a polymerized organic metal compound was formed as in Examples 18-26 under the conditions described in TABLE 4. To obtain a printed wiring board the film was then subjected to chemical nickel plating as in Examples 7 to 13. It was found by means of X-ray microanalyzer that the micropores of the anodic oxide film was impregnated with the polymerized organic metal compound to the innermost portion.

EXAMPLE 28

Five 2S aluminum plates were prepared and subjected to anodization and vacuum impregnate as in Examples 18-27 under the conditions given in TABLE 4, after which they were subjected to hydrolysis by allowing them to stand in the air for 24 hours and then heated up to 130° C. for 2 hours for polymerization of the organic metal compound. Then the plates were subjected to masking, and cut into fifteen test pieces of $10 \times 10 \times 1$ mm$^3$ in dimensions which were in turn subjected to electroless plating as in Example 15.

TABLE 4

| EXAMPLE | 18 | 19 | 20 | 21 | 22 | 23 | 24 |
|---|---|---|---|---|---|---|---|
| Base Material | 2S aluminum plate | Al—Si alloy plate*7 | Al—Si alloy plate*8 | 2S aluminum plate | 2S aluminum plate | Al—Si alloy plate*3 | 2S aluminum plate*5 |
| Dimensions (mm) | 100 × 50 × 1 | 100 × 50 × 2 | 100 × 50 × 2 | 100 × 50 × 1 | 100 × 50 × 1 | 100 × 50 × 2 | 100 × 50 × 2 |
| Anodizing Treatment | | | | | | | |
| Electrolytic solution | | | | | | | |
| NaOH (M/l) | 0.2 | — | — | — | — | — | — |
| $H_2O_2$ (wt %) | 2 | — | — | — | — | — | — |
| $Na_4P_2O_7$ | 0.075 | — | — | — | — | — | — |
| $(NH_4)_2C_2H_4O_6$ (M/l) | — | 0.1 | — | — | — | — | — |
| $NH_4OH$ (M/l) | — | 2.3 | — | — | — | — | — |
| $(NH_4)_2CO_3$ (M/l) | — | 0.1 | — | — | — | — | — |
| $NH_4F$ (M/l) | — | 0.3 | — | — | — | — | — |
| Aqueous oxalic acid solution (wt %) | — | — | 10 | — | — | 5 | — |
| Aqueous sulfuric acid solution (wt %) | — | — | — | 15 | 15 | — | 15 |
| Bath temperature (°C.) | 15 | 15 | 30 | | | | |
| Current density (A/dm$^2$) | 2 | 2 | 4 | | | | |
| Film thickness (μm) | 10 | 12 | 30 | 30 | 30 | 30 | 30 |
| Impregnating Treatment | | | | | | | |
| Impregnating solution (vol %) | | | | | | | |
| $(C_3H_7O)_2Ti(C_5H_9O_3)_2$ | 50 | — | — | — | — | — | — |
| Isopropanol | 50 | 40 | 40 | 40 | 40 | 50 | — |
| $CH_3Al(C_4H_9O)_2$ | — | 60 | 60 | — | 60 | 50 | — |
| $(C_4H_9O)_2Ti(C_8H_{16}O_2)_2$ | — | — | — | 60 | — | — | 50 |
| Ethanol | — | — | — | — | — | — | 50 |
| Polymerizing Step | | | | | | | |
| Temperature (°C.) | 130 | 130 | 100 | 100 | 100 | 120 | 130 |
| Treatment time (hour) | 2 | 2 | 2 | 2 | 2 | 3 | 2 |
| Dielectric Strength (volt) | 100 | 150 | 800 or more | 800 or more | 700 or more | 700 or more | 800 |

| EXAMPLE | 25 | 26 | 27 | 28 |
|---|---|---|---|---|
| Base Material | 2S aluminum plate*5 | Al—Si alloy plate*8 | Al—Si alloy plate*3 | 2S aluminum plate |
| Dimensions (mm) | 100 × 50 × 2 | 100 × 50 × 2 | 100 × 50 × 2 | 100 × 50 × 1 |
| Anodizing Treatment | | | | |
| Electrolytic solution | | | | |
| NaOH (M/l) | — | — | — | — |
| $H_2O_2$ (wt %) | — | — | — | — |
| $Na_4P_2O_7$ (M/l) | — | — | — | — |
| $(NH_4)_2C_2H_4O_6$ (M/l) | — | — | — | — |
| $NH_4OH$ (M/l) | — | — | — | — |
| $(NH_4)_2CO_3$ (M/l) | — | — | — | — |
| $NH_4F$ (M/l) | — | — | — | — |
| Aqueous oxalic acid solution (wt %) | — | 10 | 5 | 17 |
| Aqueous sulfuric acid solution (wt %) | 15 | — | — | — |
| Bath temperature (°C.) | | 30 | | 20 |
| Current density (A/dm$^2$) | | 4 | | 2 |
| Film thickness (μm) | 30 | 30 | 30 | 30 |

TABLE 4-continued

| | | | | |
|---|---|---|---|---|
| Impregnating Treatment | | | | |
| Impregnating solution (vol %) | | | | |
| $(C_3H_7O)_2Ti(C_5H_9O_3)_2$ | — | — | 50 | — |
| Isopropanol | — | 40 | 50 | 50*9 |
| $CH_3Al(C_4H_9O)_2$ | 50 | — | — | — |
| $(C_4H_9O)_2Ti(C_8H_{16}O_2)_2$ | — | 60 | — | — |
| Ethanol | 50 | — | — | — |
| Polymerizing Step | | | | |
| Temperature (°C.) | 130 | 100 | 120 | 130 |
| Treatment time (hour) | 2 | 2 | 3 | 2 |
| Dielectric Strength (volt) | 800 | 800 or more | 800 or more | 500 |

*7Plate made of aluminum-silicon alloy containing 11% by weight of silicon.
*8Plate made of aluminum-silicon alloy containing 9% by weight of silicon and having through holes of minimum diameter 1 mm, the holes each having a spherical portion.
*9Five test pieces were subjected to impregnating treatment using isopropanol solution of girconium isopropoxide (50 vol %), tri(n-butyl ester) phosphate (50 vol %), tri(n-butyl ester) borate (50 vol %), methyl germanium trimethoxide (50 vol %), or dimethyl oxyethyl tin (50 vol %).

EXAMPLES 29-31

An anodic oxide film was under the conditions given in TABLE 5 formed on a test piece for each example by anodization, and subjected to impregnation treatment by applying impregnating solution containing a polymerizable organic metal compound to the film after which the organic metal compound impregnated into the film was polymerized by heating up to 130° C. for 2 hours after drying the film to form a organic metal compound coating thereon of about 10 μm thickness. With respect to Examples 30 and 31 each film having a polymer layer thus formed thereon was subjected to chemical plating after activation as in Examples 7-13 to form a circuit conductor. Then the dielectric insulation between the circuit conductor and the parent metal of the printed wiring board was determined. With respect to Example 30, although the wiring board was heated up to 350° C. for 20 minutes, neither cracking nor degradation of electrical insulation of the anodic oxide film was noted. Also, no degradation of electrical insulation of the film due to moisture in the air was noted after the finished sample in each example was allowed to stand in a room for one week.

TABLE 5

| EXAMPLE | 29 | 30 | 31 |
|---|---|---|---|
| Base Material | 2S aluminum plate | Al—Si alloy plate*3 | 2S aluminum plate*5 |
| Dimensions (mm) | 100 × 50 × 1 | 100 × 50 × 2 | 100 × 50 × 2 |
| Anodizing Treatment | | | |
| Electrolytic solution | | | |
| Aqueous sulfuric acid solution (wt %) | 15 | — | 15 |
| Aqueous oxalic acid solution (wt %) | — | 5 | — |
| Film thickness (μm) | 30 | 30 | 30 |
| Impregnating Treatment | | | |
| Impregnation solution | | | |
| Ethanol | 80 | 80 | 80 |
| $CH_2=CHSi(OC_2H_4OCH_3)_3$ | 20 | — | 20 |
| Vinyl tris (β-methoxy ethoxy) silane | — | 20 | — |
| Insulating Voltage (kV) | 1 or more | 0.6 | 1 or more |

EXAMPLE 32

An anodic oxide film was formed on a 100 mm×50 mm×1 mm 2S aluminum plate as in Example 29. Then, the test piece was immersed and allowed to stay in an ethanol solution of $CH_2=CHSi(OC_2H_4OCH_3)_3$ (20 vol %) for one hour, so that the solution permeated or diffused into the micropores of the anodic oxide film. After the test piece was taken up from the ethanol solution, the solution adhered to the surfaces thereof was removed by wiping, the organic metal compound which diffused into the anodic oxide film was subjected to polymerization treatment by heating at 150° C. for two hours. The insulating voltage of the anodic oxide film was 500 V or more.

EXAMPLE 33

Twelve sample plates of 2S aluminum having dimensions of 50 mm×100 mm×1 mm were prepared and anodized in an ammonium tartrate solution under the temperature and current density conditions described in TABLE 6 to a film thickness of 10μ. The sample plates having anodic oxide films thus formed were each heated up to a temperature at which cracking of the film was noted. The cracking temperature are shown in the following table.

TABLE 6

| Bath Temperature (°C.) | D.C. Current Density (A/dm²) | | | |
|---|---|---|---|---|
| | 0.5 | 1 | 5 | 10 |
| 5 | 420° C. | 420° C. | 450° C. | 500° C. or more |
| 20 | 430° C. | 450° C. | 480° C. | 500° C. or more |
| 30 | 450° C. | 480° C. | 500° C. or more | 500° C. or more |

As apparent from the table, within wide ranges of the bath temperature and current density there was noted no cracking of the anodic oxide films up to around 400° C., and the films were excellent in heat resistance.

What is claimed is:
1. A process of treating an anodic oxide film, comprising the steps of:

(a) anodizing an aluminum or aluminum alloy base material in an electrolytic solution containing ammonium ions present in a concentration from about 5 to about 80 g/l, at a temperature of about 5° to about 40° C. with a current density in the range of about 0.5 to about 10 A/dm$^2$, thereby forming an anodic oxide film thereon, the anodic oxide film having micropores therein;

(b) dissolving a polymerizable organometallic compound in a solvent selected from the group consisting of an organic solvent, water and mixtures thereof, the organometallic compound being represented by the formula:

$$X_n MR_m$$

wherein: X is an organic functional group selected from vinyl, amino, mercapto, epoxy, methyl, and phenyl groups; M is a metallic atom selected from Si, Ti, Zr, Al, B, P, Ge, and Sn; R is a hydrolyzable organic group selected from alkoxy and acetoxy groups; and n+m=3, 4, 5 or 6;

(c) after the step (b), impregnating the anodic oxide film by electrophoresis or electropermeation with the organometallic compound dissolved in the solvent material of step (b); and (d) polymerizing and hardening the organometallic compound impregnated into the anodic oxide film, thereby filling and sealing the micropores of the anodic oxide film with a polymerized organometallic compound.

2. The process as claimed in claim 1 in which the current density of anodization step (a) is in the range of about 1.5 to about 5 A/dm$^2$.

3. The process as claimed in claim 1 in which the base material is an aluminum-silicon alloy containing not more than about 20% by weight silicon.

4. A process of treating an anodic oxide film, comprising the steps of:

(a) anodizing an aluminum or aluminum alloy base material in an electrolytic solution containing sodium ions present in a concentration from about 1 to about 30 g/l, at a temperature of about 5° to about 40° C. with a current density in the range of about 0.5 to about 10 A/dm$^2$, thereby forming an anodic oxide film thereon, the anodic oxide film having micropores therein;

(b) dissolving a polymerizable organometallic compound in a solvent selected from the group consisting of an organic solvent, water and mixtures thereof, the organometallic compound being represented by the formula:

$$X_n MR_m$$

wherein: X is an organic functional group selected from vinyl, amino, mercapto, epoxy, methyl, and phenyl groups; M is a metallic atom selected from Si, Ti, Zr, Al, B, P, Ge, and Sn; R is a hydrolyzable organic group selected from alkoxy and acetoxy groups; and n+m=3, 4, 5 or 6;

(c) after the step (b), impregnating the anodic oxide film by electrophoresis or electropermeation with the organometallic compound dissolved in the solvent material of step (b); and (d) polymerizing and hardening the organometallic compound impregnated into the anodic oxide film, thereby filling and sealing the micropores of the anodic oxide film with a polymerized organometallic compound.

5. The process as claimed in claim 4 in which the current density of anodization step (a) is in the range of about 1.5 to about 5 A/dm$^2$.

6. The process as claimed in claim 4 in which the base material is an aluminum-silicon alloy containing not more than about 20% by weight silicon.

7. A process of treating an anodic oxide film, comprising the steps of:

(a) anodizing an aluminum or aluminum alloy base material in an electrolytic solution containing from about 4 to about 25% by weight of oxalic acid at a temperature of about 20° to about 50° C. and a current density of about 0.5 to about 10 A/dm$^2$ to form an anodic oxide film thereon, the anodic oxide film having micropores therein;

(b) dissolving a polymerizable organometallic compound in a solvent selected from the group consisting of an organic solvent, water and mixtures thereof, the organometallic compound being represented by the formula:

$$X_n MR_m$$

wherein: X is an organic functional group selected from vinyl, amino, mercapto, epoxy, methyl, and phenyl groups; M is a metallic atom selected from Si, Ti, Zr, Al, B, P, Ge, and Sn; R is a hydrolyzable organic group selected from alkoxy and acetoxy groups; and n+m=3, 4, 5 or 6;

(c) after the step (b), impregnating the anodic oxide film by electrophoresis or electropermeation with the organometallic compound dissolved in the solvent material of step (b); and (d) polymerizing and hardening the organometallic compound impregnated into the anodic oxide film, thereby filling and sealing the micropores of the anodic oxide film with a polymerized organometallic compound.

8. The process as claimed in claim 7 in which the current density of anodization step (a) is in the range of about 1.5 to about 5 A/dm$^2$.

9. The process as claimed in claim 7 in which the base material is an aluminum-silicon alloy containing not more than about 20% by weight silicon.

* * * * *

UNITED STATES PATENT AND TRADEMARK OFFICE
CERTIFICATE OF CORRECTION

PATENT NO. : 4,483,751
DATED : November 20, 1984
INVENTOR(S) : Seizo MURAYAMA et al It is certified that error appears in the above—identified patent and that said Letters Patent is hereby corrected as shown below:

On the Title Page in the Heading:

In the fourth line of Item [30] read:

"Mar. 11, 1981 [JP] Japan.....56-13945 as

-- Feb. 2, 1981 [JP] Japan.....56 13945 --

Signed and Sealed this

Third Day of September 1985

[SEAL]

Attest:

DONALD J. QUIGG

Attesting Officer — Acting Commissioner of Patents and Trademarks - Designate